(12) United States Patent
Kintis et al.

(10) Patent No.: US 7,348,863 B2
(45) Date of Patent: Mar. 25, 2008

(54) SIMPLE TIME DOMAIN PULSE GENERATOR

(75) Inventors: Mark Kintis, Manhattan Beach, CA (US); Flavia S. Fong, Monterey Park, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 265 days.

(21) Appl. No.: 11/176,029

(22) Filed: Jul. 6, 2005

(65) Prior Publication Data

US 2007/0008048 A1  Jan. 11, 2007

(51) Int. Cl.
- *H03K 3/017* (2006.01)
- *H03K 3/02* (2006.01)
- *H03K 12/00* (2006.01)
- *H04B 3/02* (2006.01)

(52) U.S. Cl. .................. 333/20; 307/106; 327/184; 327/291; 327/293; 327/294

(58) Field of Classification Search ............. 333/20; 307/106; 327/184, 291, 293, 294
See application file for complete search history.

(56) References Cited

U.S. PATENT DOCUMENTS

| | | | |
|---|---|---|---|
| 3,205,375 A | 9/1965 | Berry | |
| 3,418,604 A | 12/1968 | Ross | |
| 3,462,699 A | 8/1969 | Sear | |
| 5,014,018 A | 5/1991 | Rodwell et al. | |
| 5,023,574 A | 6/1991 | Anklam et al. | |
| 5,157,361 A | 10/1992 | Gruchalla et al. | |
| 5,208,560 A | 5/1993 | Yasutake | |
| 5,256,996 A | 10/1993 | Marsland et al. | |
| 5,274,271 A | 12/1993 | McEwan | |
| 5,352,627 A | 10/1994 | Cooper | |
| 5,352,994 A | 10/1994 | Black et al. | |
| 5,396,198 A | 3/1995 | Yamashita et al. | |
| 5,789,994 A | 8/1998 | Case et al. | |
| 5,804,921 A | 9/1998 | McEwan et al. | |

(Continued)

FOREIGN PATENT DOCUMENTS

EP  0 419 078  3/1991

OTHER PUBLICATIONS

Falah, M. et al.; "High Data Rate Pulse Regeneration Using Non-Linear Transmission Line Technology"; 2001 IEEE 6th High Frequency Postgraduate Student Colloquium, Sep. 9-10, 2001, pp. 136-141.*

Rodwell et al., "GaAs Nonlinear Transmission Lines for Picosecond Pulse Generation and Millimeter-Wave Sampling," IEEE MTT, vol. 39, No. 7, pp. 1194-1204, Jul. 2001.

(Continued)

*Primary Examiner*—Barbara Summons
(74) *Attorney, Agent, or Firm*—Tarolli, Sundheim, Covell & Tummino LLP

(57) ABSTRACT

A pulse generating circuit and related method, for producing extremely narrow pulses for use in monolithic microwave integrated circuits (MMICs) for radar, high-speed sampling, pulse radio and other applications. A sinusoidal input signal is supplied to two nonlinear shock wave generators, which are oppositely biased to produce periodic outputs that are mirror images of each other, one with a very steep rising edge and one with a very steep falling edge. The combined outputs would cancel each other completely but for the introduction of a slight time delay in one of them, which results in a narrow peak in the combined signals.

10 Claims, 6 Drawing Sheets

U.S. PATENT DOCUMENTS 6,239,637 B1 5/2001 Williamson
6,320,480 B1 * 11/2001 Kintis et al. ................ 333/156
6,538,525 B1 * 3/2003 Williamson .................. 333/20
6,690,247 B2 2/2004 Kintis et al.
7,193,486 B2 * 3/2007 Mrozek et al. ............... 333/20
2003/0146800 A1 8/2003 Dvorak

OTHER PUBLICATIONS

Rodwell M J W: "GAAS Nonlinear Transmission Lines for Picosecond Pulse Generation and Millimeter-Wave Sampling"; NJ, U.S., vol. 39, No. 7, Jul. 1, 1991 pages 1194-1204, XP000206295 ISSN:0018-9480.
International Search Report for corresponding PCT/US2006/025553, completed Aug. 17, 2007 by John Jepsen of the EPO.

* cited by examiner

SIMPLE TIME DOMAIN PULSE GENERATOR

BACKGROUND OF THE INVENTION

This invention relates generally to pulse generators and, more particularly, to pulse generators that can be easily integrated into monolithic microwave integrated circuits (MMICs). Short duration (i.e., narrow) pulses have practical application in time domain measurement in the terahertz region. For reference, a terahertz (THz) is $10^{12}$ hertz, or a thousand gigahertz (GHz). Short pulses are also needed in radar transmitters, high speed sampling applications, and in impulse radio, an emerging technology that requires very narrow pulses with very short rise and fall times. Commercially available pulse generators are less than adequate for advanced microwave, millimeter-wave, radar, or high speed digital sampling applications.

The pulse generator described and claimed in U.S. Pat. No. 6,690,247, entitled "Nonlinear Transmission Line Waveform Generator Having an Input Voltage Matched to the C/V Characteristic of the Transmission Line," issued in the names of Mark Kintis et al. and assigned to the same assignee as the present application, addressed many of the problems of the prior art but presented implementation difficulties. The disclosure of the referenced patent is incorporated by reference into this description.

Nonlinear transmission lines are generally known in the art. Examples of such nonlinear transmission lines are disclosed in: "GaAs Nonlinear Transmission Lines for Picosecond Pulse Generation and Millimeter Wave Sampling", by Rodwell, et al., IEEE Transactions on Microwave Theory and Techniques, vol. 39, no. 7, July 1991, pages 1194-1204; U.S. Pat. Nos. 5,352,994; 5,352,627; 5,023,574; 5,256,996; 5,789,994; 5,014,018; and 5,157,361, all of which are also incorporated by reference into this description. Such nonlinear transmission lines are used in various applications, such as harmonic generators and in the generation of relatively short duration narrow pulses in the hundreds of picosecond range, which provide increased bandwidth in certain applications, such as ultra wideband radio applications, also known as impulse radios. Ultra wideband radios, which are generally known in the art, utilize relatively short-duration pulses with pulse widths measured in the hundreds of picoseconds, for example. These short-duration pulses are pulse-position modulated, to increase the bandwidth of such radios up to, for example, 5 GHz. There is an ever increasing demand to increase the bandwidth of such impulse radios, as well as that of other microwave devices. The bandwidth of ultra-wideband radios is limited by the current technology in which the shortest duration pulses that can be generated are on the order of hundreds of picoseconds. To meet the demand for higher bandwidth impulse radios and other applications, there is a need to provide a system for generating pulses having pulse widths less than hundreds of picoseconds in duration.

Accordingly, there is still much room for improvement in the field of time domain pulse generation for MMIC applications. The present invention is directed to that end.

SUMMARY OF THE INVENTION

The present invention provides a significant improvement in pulse generation for microwave and millimeter-wave applications, over the technique described in U.S. Pat. No. 6,690,247. Briefly, and in general terms, the pulse generator of the invention comprises first and second nonlinear transmission lines (NLTLs) connected to receive a sinusoidal input signal, and configured to produce first and second output signals, respectively, that are mirror images of each other with respect to a selected amplitude level. The pulse generator of the invention also comprises a time delay element interposed in series with one of the first and second NLTLs, whereby one of the first and second output signals is delayed with respect to the other; and means for combining the first and second output signals into a composite output signal. The first and second output signals substantially cancel each other except for a time duration corresponding to the selected time delay, during which the composite output signal is a pulse.

Preferably, the selected time delay element is connected in an input line to one of the NLTLs, since the bandwidth of the input signal is much lower than the bandwidth of either of the output signals. The components of the pulse generator are easily implemented as part of a monolithic microwave integrated circuit (MMIC).

More specifically, the first NLTL is negatively biased and the first output signal includes steep falling edges that are negative with respect to ground; while the second NLTL is positively biased and the second output signal includes steep rising edges that a positive with respect to ground. Thus, if the time delay is selected to delay the first output signal with respect to the second, the composite signal includes a steep leading edge derived from the second output signal and a steep falling edge derived from the first output signal.

The selected time delay element may be an adjustable phase delay circuit or a transmission line providing the selected delay.

In terms of a method, the invention comprises the steps of supplying a first nonlinear transmission line (NLTL) with a sinusoidal input signal; supplying a second nonlinear transmission line (NLTL) with an identical sinusoidal input signal; generating in the first NLTL a first periodic output signal that has a steep falling edge; generating in the second NLTL a second periodic output signal that has a steep rising edge and is a mirror image of the first periodic output signal; delaying one of the first and second output signals with respect to the other; and combining the first and second output signal to produce a composite output signal in which the first and second output signals substantially cancel except in the region of a narrow output pulse.

It will be appreciated from the foregoing that the present invention represents a significant advance in the field of pulse generation for microwave and millimeter wave applications implemented in MMIC technology which provides very tight parameter matching of the multitude of diodes making up a given NLTL line. Also, an all MMIC implementation where both NLTL's are on the same chip would result in the very tight parameter matching for both NLTL's required to create such precise narrow pulse widths via extremely accurate waveform matching and cancellation. Specifically, where In particular, the invention provides for the generation of extremely narrow pulses that are useful in radar, high-speed sampling, pulse radio and other applications. Other aspects and advantages of the invention will become apparent from the following more detailed description, taken in conjunction with the accompanying drawings.

DETAILED DESCRIPTION OF THE INVENTION

Figure 1:
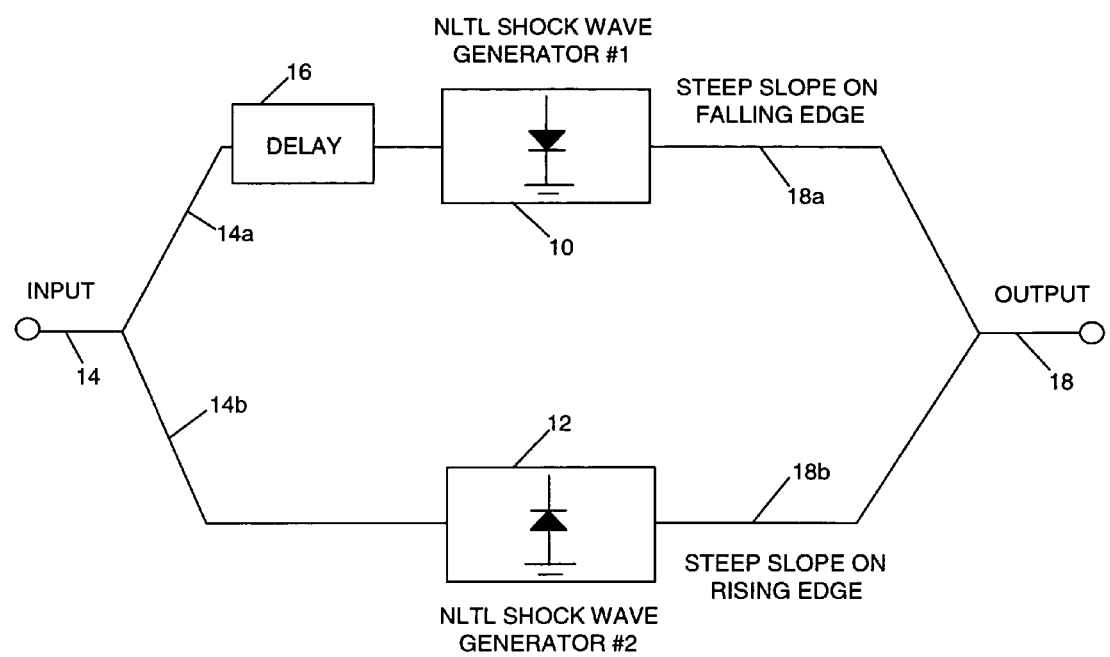
FIG. 1 is a block diagram of a preferred embodiment of the present invention.

As shown in the drawings for purposes of illustration, the present invention is concerned with the generation of narrow pulses in the time domain, for use in high speed sampling applications, radar and other microwave and millimeter-wave technologies.

In accordance with the invention, and as will be described in more detail below, narrow pulses are generated by combining the outputs of two oppositely biased nonlinear transmission line (NLTL) shock wave generators, indicated at 10 and 12 in FIG. 1. A sinusoidal input signal is provided on input line 14, which is split into two input lines 14a and 14b, connected to NLTL shock wave generators 10 and 12, respectively. A delay 16, which may be simply a transmission line of selected length or a controllable phase shifter, is interposed in one of the input lines 14a and 14b to effect a slight time displacement between the two output signals that appear on output lines 18a and 18b, respectively, from the NLTL shock wave generators 10 and 12. The two output lines 18a and 18b merge into a single output line 18.

Figure 2A:
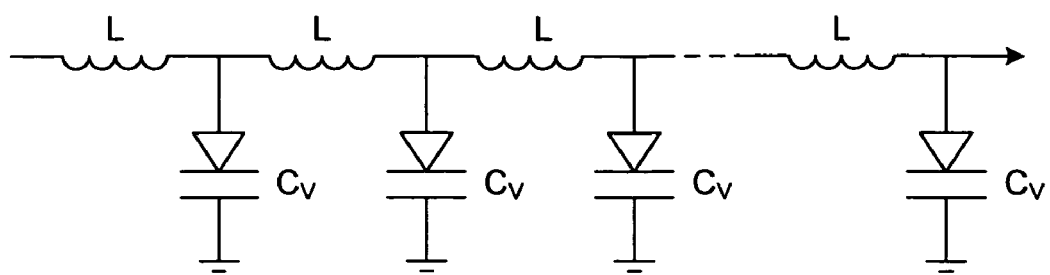
FIGS. 2A and 2B are simplified equivalent circuit diagrams of the respective nonlinear transmission lines (NLTLs) depicted in FIG. 1.
Figure 2B:
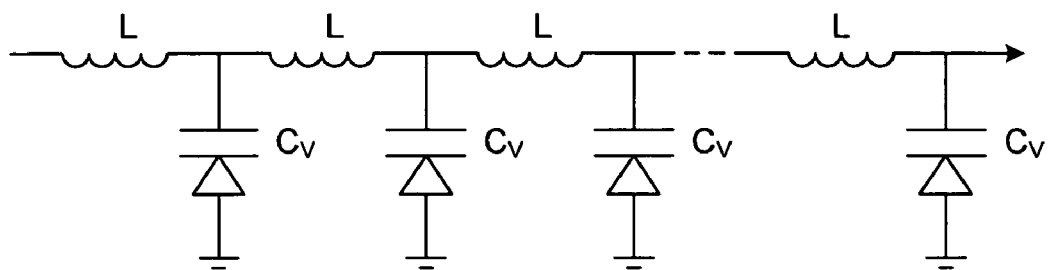

As depicted in FIGS. 2A and 2B, an NLTL shock wave generator may be represented by an equivalent circuit that includes a series string of inductances L and an approximately equal number of shunt variable capacitors (varactors) $C_v$. It will be understood that in a practical realization of the NLTL the inductances L and varactors $C_v$ have impedances that are distributed uniformly along the transmission line, rather than having the discrete values implied by the depiction of FIGS. 2A and 2B. Such NLTLs can be formed as monolithic microwave integrated circuits (MMICs), for example as disclosed in U.S. Pat. No. 5,014,018, which is incorporated by reference into this description.

Figure 3A:
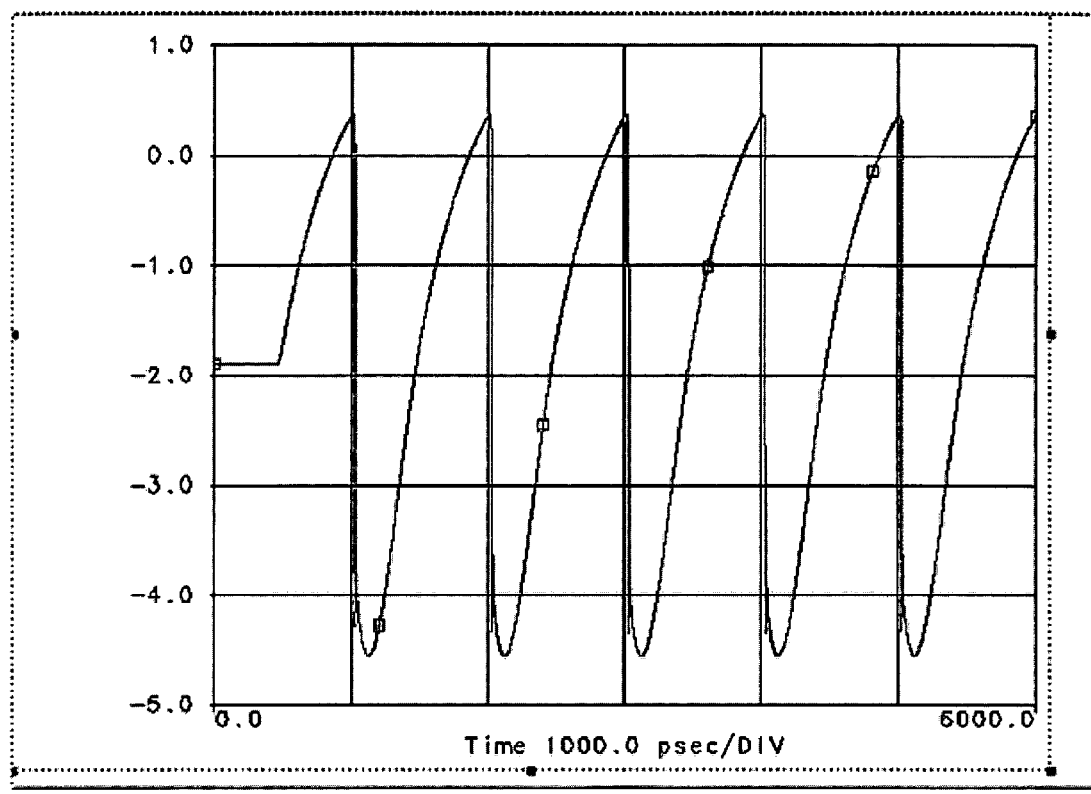
FIGS. 3A and 3B are graphs of output signals from the respective NLTLs in FIG. 1.
Figure 3B:
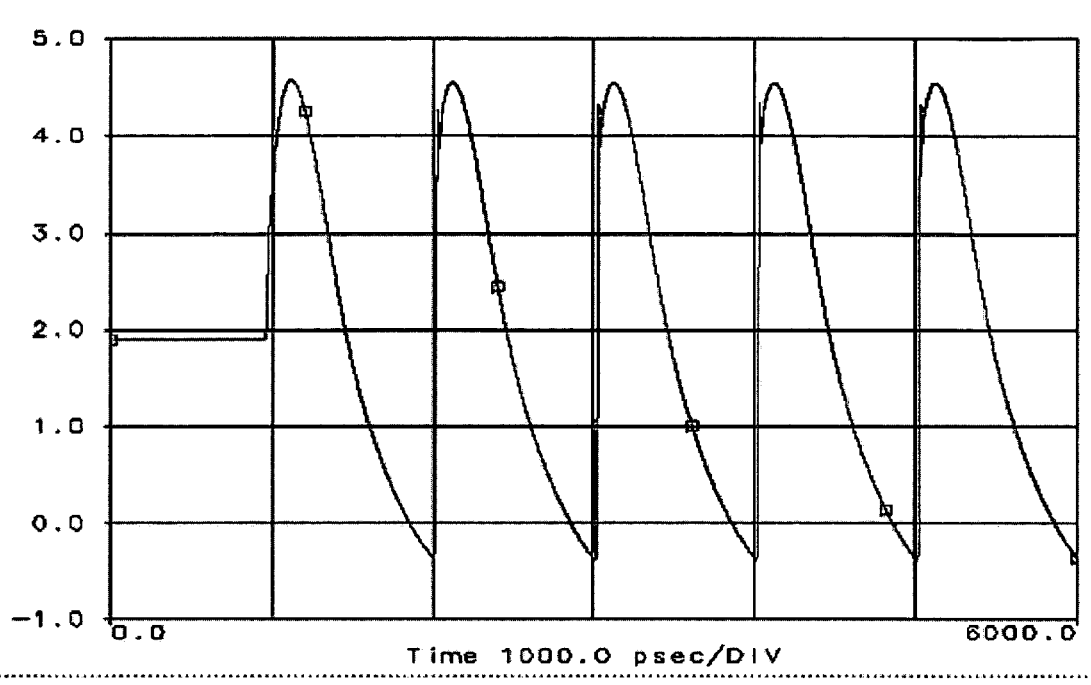

The parallel NLTL shock wave generators have identical impedance parameters except that the distributed varactors in each are oppositely directed and oppositely biased. More specifically, in the NLTL 10 the cathode side of the varactor diode is connected to ground and, as shown in the graph of FIG. 3A, the NLTL 10 is negatively biased. In the other NLTL 12, the anode side of the varactor diode is connected to ground and, as shown in the graph of FIG. 3B, the NLTL 12 is positively biased.

It is well known in the art of NLTLs that the nonlinearity of this type of transmission line arises because a varactor provides a shunt capacitance value that varies with voltage, and this variation results in a transmission line delay that also varies with voltage. The output signal produced has a steep transition (in one direction) between maximum and minimum values, instead of the more gradual transition of the sinusoidal input. The NLTL shock wave generator 10 produces an output with a steep transition on the falling edge of each signal cycle, as shown in FIG. 2A, while the generator 12 produces an output with a steep transition on the rising edge of each signal cycle, as shown in FIG. 2B. In each case, the nonlinearity of the generator characteristic renders the other (non-steep) edge of the output signal even more gradual than the slope of the sinusoidal input. Therefore, the output signal profile in each case is approximately triangular in shape, where the output from generator 10 is characterized by an almost vertical falling edge followed by a gradually sloped rising edge, and the output from generator 12 is characterized by an almost vertical rising edge followed by a gradually sloped falling edge.

Figure 4:
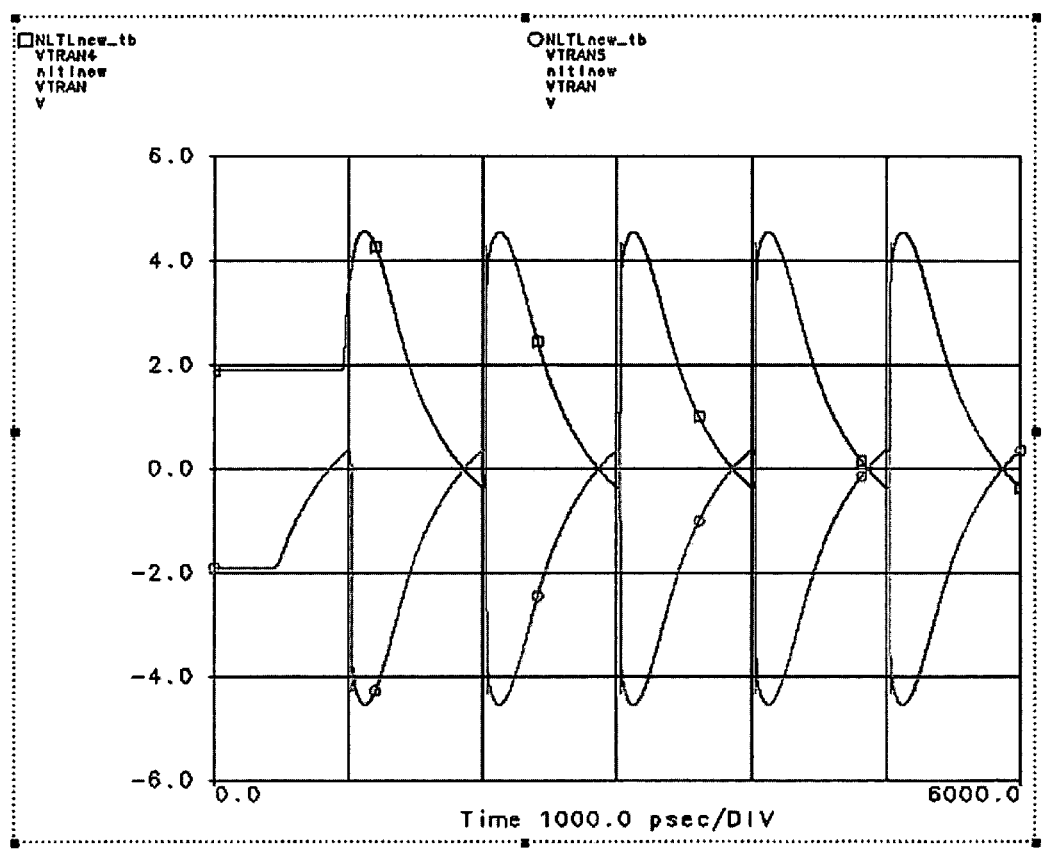
FIG. 4 shows the graphs of FIGS. 3A and 3B plotted together.
Figure 5:
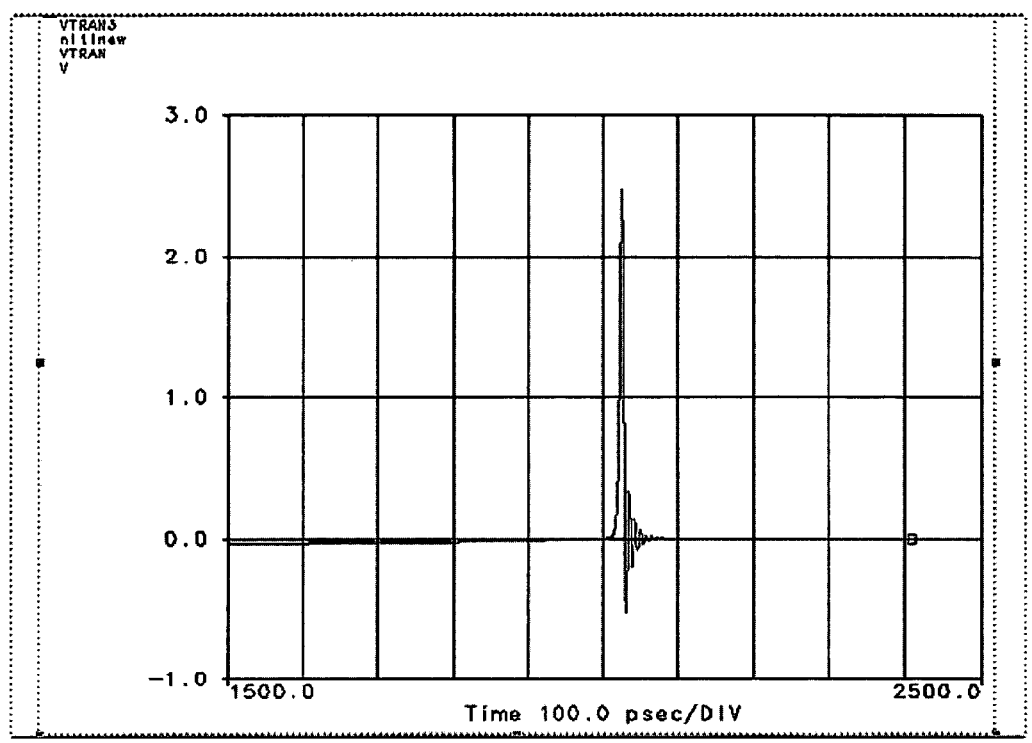
FIG. 5 is a graph of a single pulse resulting from combining the two graphs in FIG. 4, plotted on a magnified time scale.

When these two shock wave generator outputs are combined on line 18, they appear substantially as depicted in FIG. 4, where the lower curve represents the output on line 18a from generator 10, and the upper curve represents the output on line 18b from generator 12. If the two outputs were perfectly in phase they would completely cancel each other, since it is apparent from FIG. 4 that the two curves are mirror images of each other with respect to the zero voltage axis. However, when the delay or phase shifter 16 is selected (or adjusted) to provide a very small phase difference between the two curves in FIG. 4, the resulting composite output is a series of very short pulses, one of which is shown in FIG. 5. Whether the pulses are positive going or negative going is determined by which of the two waves is leading with respect to the other. In FIG. 5, the rising edge of the depicted pulse is derived from steep rising edge of the signal from generator 12, which leads the other output signal slightly. The steep falling edge of the pulse is derived from the steep falling edge of the signal from generator 10. Only one pulse is visible in FIG. 5 because the time scale along the horizontal axis is magnified so much that the adjacent pulses are off-scale to the left and right of the figure.

The delay 16 may be a delay line of a length selected to provide a desired relative time delay between the shock wave generators 10 and 12, resulting in a desired pulse duration on output line 18. The delay 16 may also be an adjustable phase shifter. Although FIG. 1 shows the delay 16 interposed in one of the input lines 14a and 14b, it will be appreciated that the desired time difference could also be effected by interposing a delay in one of the output lines 18a and 18b. Placing the delay in an input line is preferred, however, because the sinusoidal input signal has, of course, a much narrower bandwidth than that of the shock wave generator outputs. Creating a true time delay for a wide-bandwidth signal presents significant design difficulties.

It will be appreciated from the foregoing that the present invention represents a significant advance in the field of time domain pulse generators capable of producing extremely short pulses. The pulse generator of the invention employs only three basic components to generate pulse outputs from a sinusoidal input. By combining outputs from two oppositely biased NLTL shock wave generators and delaying one output with respect to the other, very narrow pulses are reliably generated. It will also be appreciated that the pulse generator of the invention can be implemented using monolithic microwave integrated circuit (MMIC) technology, and therefore conveniently integrated with other MMIC functions. Although a specific embodiment of the invention has been illustrated and described for purposes of illustration, it will be understood that various modifications may be made without departing from the spirit and scope of the invention. Accordingly, the invention should not be limited except as by the appended claims.

The invention cliamed is:

1. A pulse generator, comprising:

first and second nonlinear transmission lines (NLTLs) connected to receive a sinusoidal input signal, and configured to produce first and second output signals, respectively, that are mirror images of each other with respect to a selected amplitude level, wherein the first output signal is a periodic signal with steep falling edges and the second output signal is a periodic signal with steep rising edges;

a selected time delay element interposed in series with one of the first and second NLTLs, whereby one of the first and second output signals is delayed with respect to the other; and means for combining the first and second output signals into a composite output signal in which the first and second output signals substantially cancel each other except for a time duration corresponding to the selected time delay, during which the composite output signal is a pulse.

2. A pulse generator as defined in claim 1, wherein the selected time delay element is connected in an input line to one of the NLTLs.

3. A pulse generator as defined in claim 1, wherein the components of the pulse generator are implemented as part of a monolithic microwave integrated circuit (MMIC).

4. A pulse generator as defined in claim 1, wherein:
the first NLTL is negatively biased and the first output signal includes steep falling edges that are negative with respect to ground;
the second NLTL is positively biased and the second output signal includes steep rising edges that a positive with respect to ground; and
when the time delay is selected to delay the first output signal with respect to the second, the composite signal includes a steep leading edge derived from the second output signal and a steep falling edge derived from the first output signal.

5. A pulse generator as defined in claim 1, wherein the selected time delay element is an adjustable phase delay circuit.

6. A pulse generator as defined in claim 1, wherein the selected time delay element is a transmission line.

7. A method for generating narrow, time domain pulses, comprising:
supplying a first nonlinear transmission line (NLTL) with a sinusoidal input signal;
supplying a second nonlinear transmission line (NLTL) with an identical sinusoidal input signal;
generating in the first NLTL a first periodic output signal that has a steep falling edge;
generating in the second NLTL a second periodic output signal that has a steep rising edge and is a mirror image of the first periodic output signal;
delaying one of the first and second output signals with respect to the other; and
combining the first and second output signal to produce a composite output signal in which the first and second output signals substantially cancel except in the region of a narrow output pulse.

8. A method as defined in claim 7, wherein the step of delaying is effected by a delay element interposed in an input to one of the first and second NLTLs.

9. A method as defined in claim 7, wherein:
the step of generating a first periodic output signal includes negatively biasing the first NLTL, such that the first periodic output signal is predominantly negative with respect to a reference level;
the step of generating a second periodic output signals includes positively biasing the second NLTL, such that the second periodic output signal is predominantly positive with respect to the same reference level; and
the composite output signal includes a steep leading edge derived from the second output signal and a steep falling edge derived from the first output signal.

10. A method as defined in claim 7, and further comprising the step of controlling the delaying step to provide a desired pulse width in the composite output signal.

* * * * *